US012408502B2

(12) United States Patent
Tai et al.

(10) Patent No.: US 12,408,502 B2
(45) Date of Patent: *Sep. 2, 2025

(54) ELECTRONIC DEVICE

(71) Applicant: Innolux Corporation, Miaoli County (TW)

(72) Inventors: Ming-Jou Tai, Miaoli County (TW); Chia-Hao Tsai, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/764,192

(22) Filed: Jul. 4, 2024

(65) Prior Publication Data

US 2024/0363822 A1 Oct. 31, 2024

Related U.S. Application Data

(63) Continuation of application No. 18/149,162, filed on Jan. 3, 2023, now Pat. No. 12,062,747, which is a continuation of application No. 17/093,638, filed on Nov. 10, 2020, now Pat. No. 11,575,075.

(60) Provisional application No. 62/933,989, filed on Nov. 12, 2019.

(30) Foreign Application Priority Data

Sep. 28, 2020 (CN) .......................... 202011041245.0

(51) Int. Cl.
*H10H 20/857* (2025.01)
(52) U.S. Cl.
CPC ................................ *H10H 20/857* (2025.01)

(58) Field of Classification Search
CPC .. H10H 20/857; H10D 84/0109; H10D 1/045; H10D 64/511; H10D 10/821; H01L 33/62; H01L 29/78618; H01L 29/41733; H01L 27/124
See application file for complete search history.

(56) References Cited

U.S. PATENT DOCUMENTS

| 12,062,747 | B2 * | 8/2024 | Tai | H01L 29/41733 |
| 2014/0139774 | A1 * | 5/2014 | Tsai | H10D 86/60 |
| | | | | 257/43 |
| 2014/0145195 | A1 * | 5/2014 | Kim | H01L 21/32133 |
| | | | | 438/158 |
| 2017/0033235 | A1 * | 2/2017 | Tsao | G02F 1/136227 |
| 2018/0069099 | A1 * | 3/2018 | Yu | H10D 30/0321 |
| 2019/0296050 | A1 * | 9/2019 | Yoshida | H10D 30/6731 |

(Continued)

*Primary Examiner* — Victor A Mandala
(74) *Attorney, Agent, or Firm* — JCIPRNET

(57) ABSTRACT

An electronic device includes a substrate, a first conductive wire, a plurality of semiconductors, an insulation layer and a plurality of conductive elements. The first conductive wire is configured to transmit a first signal and disposed on the substrate, and the first conductive wire extends along a first direction. The semiconductors are disposed on the substrate and overlapped with the first conductive wire. The insulation layer is disposed on the substrate and has a plurality of holes. The conductive elements are disposed on the substrate and overlapped with the semiconductors respectively. In a top view of the electronic device, each one of the plurality of holes overlaps with at least one semiconductor, and a number of the holes is less than a number of the plurality of conductive elements.

12 Claims, 8 Drawing Sheets

(56) References Cited

U.S. PATENT DOCUMENTS

| 2021/0043657 | A1* | 2/2021 | Song | H10D 86/021 |
| 2021/0305288 | A1* | 9/2021 | Tai | H10D 30/6723 |
| 2024/0402551 | A1* | 12/2024 | Sung | G02F 1/13439 |

* cited by examiner

ELECTRONIC DEVICE

CROSS-REFERENCE TO RELATED APPLICATION

This application is a continuation application of and claims the priority benefit of a prior U.S. application Ser. No. 18/149,162, filed on Jan. 3, 2023. The prior U.S. application Ser. No. 18/149,162 is a continuation application of and claims the priority benefit of a prior U.S. application Ser. No. 17/093,638, filed on Nov. 10, 2020, which claims the priority benefit of U.S. provisional application Ser. No. 62/933,989, filed on Nov. 12, 2019, and China application serial no. 202011041245.0, filed on Sep. 28, 2020. The entirety of each of the above-mentioned patent applications is hereby incorporated by reference herein and made a part of this specification.

TECHNICAL FIELD

The disclosure relates to an electronic device, and more particularly, to an electronic device that can provide better display quality.

BACKGROUND

Display panels have been widely used in electronic devices such as mobile phones, televisions, monitors, tablet computers, car displays, wearable devices, and desktop computers. With the vigorous development of electronic products, the requirements for display quality on electronic products are getting higher, making electronic devices used for display increasingly light, thin, short, small, frameless, and larger or higher resolution display effects Improve.

SUMMARY

The disclosure provides an electronic device that has better reliability or better display quality.

According to the embodiments of the disclosure, an electronic device includes a substrate, a plurality of transistors and a plurality of drain contact holes. The transistors are disposed on the substrate. Each transistor has a semiconductor, a source and a drain. The drains are electrically connected to the semiconductors through the drain contact holes. A number of the drain contact holes is less than a number of the drains.

According to the embodiments of the disclosure, an electronic device includes a substrate, a first conductive wire, a plurality of semiconductors, an insulation layer and a plurality of conductive elements. The first conductive wire is configured to transmit a first signal and disposed on the substrate, and the first conductive wire extends along a first direction. The semiconductors are disposed on the substrate and overlapped with the first conductive wire. The insulation layer is disposed on the substrate and has a plurality of holes. The conductive elements are disposed on the substrate and overlapped with the semiconductors respectively. In a top view of the electronic device, each one of the plurality of holes overlaps with at least one semiconductor, and a number of the holes is less than a number of the plurality of conductive elements.

BRIEF DESCRIPTION OF THE DRAWINGS

The accompanying drawings are included to provide a further understanding of the disclosure, and are incorporated in and constitute a part of the specification. The drawings illustrate embodiments of the disclosure and, together with the description, serve to explain the principles of the disclosure.

DETAILED DESCRIPTION

Figure 1A:
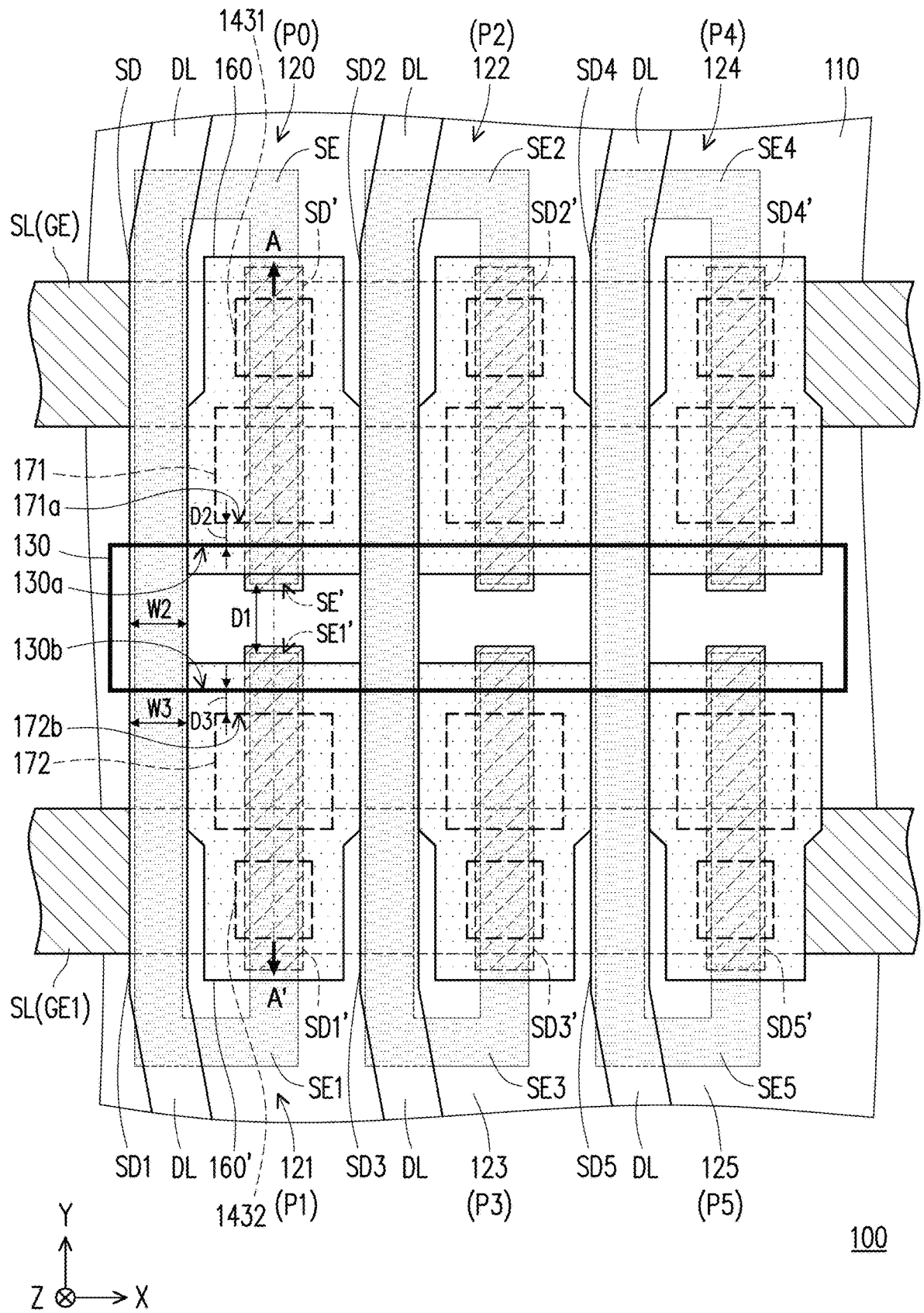
FIG. 1A is a schematic top view of an electronic device according to an embodiment of the disclosure.

The disclosure may be understood by referring to the following detailed description with reference to the accompanying drawings. It is noted that for comprehension of the reader and simplicity of the drawings, in the drawings of the disclosure, only a part of the electronic device is shown, and specific components in the drawings are not necessarily drawn to scale. Moreover, the quantity and the size of each component in the drawings are only schematic and are not intended to limit the scope of the disclosure.

In the following specification and claims, the terms "having", "including", etc. are open-ended terms, so they should be interpreted to mean "including but not limited to . . . ".

It should be understood that when a component or a film layer is described as being "on" or "connected to" another component or film layer, it may be directly on or connected to the another component or film layer, or there is an intervening component or film layer therebetween (i.e., indirect connection). Conversely, when a component or film layer is described as being "directly on" or "directly connected to" another component or film layer, there is no intervening component or film layer therebetween.

The terms such as "first", "second", "third", etc. may be used to describe components, but the components should not be limited by these terms. The terms are only intended to distinguish a component from another component in the specification. It is possible that the claims do not use the same terms and replace the terms with "first", "second", "third" etc. according to the sequence declared in the claims. Accordingly, in the specification, a first component may be a second component in the claims.

Herein, the terms "about", "approximately", "substantially", and "essentially" usually mean within 10%, or within 5%, or within 3%, or 2% or within 1%, or within 0.5% of a given value or range. The quantity given here is an approximate quantity, that is, the meaning of "about", "approximately", "substantially", and "essentially" can still be implied without specifying the terms "about", "approximately", "substantially", and "essentially". In addition, the terms "a range from a first value to a second value" and "a range between a first value and a second value" indicate that the range includes the first value, the second value, and other values in between.

In some embodiments of the disclosure, unless specifically defined, terms related to bonding and connection such as "connect", "interconnect", etc. may mean that two structures are in direct contact, or that two structures are not in direct contact with other structures provided therebetween. The terms related to bonding and connection may also cover cases where two structures are both movable or two structures are both fixed. In addition, the term "couple" includes any direct and indirect electrical connection means.

In the disclosure, the length and width may be measured by an optical microscope, and the thickness may be measured based on a cross-sectional image in an electron microscope, but the disclosure is not limited thereto. In addition, there may be a certain error between any two values or directions used for comparison.

In the disclosure, the electronic device may include a display device, an antenna device, a sensing device, a touch display, a curved display, or a free shape display, but is not limited thereto. The electronic device may be a bendable or flexible electronic device. The electronic device may include, for example, a light emitting diode (LED), a liquid crystal, a fluorescence, a phosphor, a quantum dot (QD), other suitable display media, or a combination of the above, but is not limited thereto. The light emitting diode may include, for example, an organic light emitting diode (OLED), inorganic light emitting diode (LED), a mini LED, a micro LED or a quantum dot LED (e.g., QLED or QDLED), other suitable materials, or any combination of the above, but is not limited thereto. The display device may include, for example, a splicing display device, but is not limited thereto. The antenna device may be, for example, a liquid crystal antenna, but is not limited thereto. The antenna device may include, for example, an antenna splicing device, but is not limited thereto. It is noted that the electronic device may be any combination of the above, but is not limited thereto. In addition, the shape of the electronic device may be rectangular, circular, polygonal, a shape with curved edges, or other suitable shapes. The electronic device may have peripheral systems such as a driving system, a control system, a light source system, a rack system, etc. to support a display device, an antenna device, or a splicing device. Hereinafter, an electronic device will be described to illustrate the content of the disclosure, but the disclosure is not limited thereto.

It should be noted that in the following embodiments, features in a plurality of embodiments may be replaced, recombined, or mixed to complete other embodiments without departing from the spirit of the disclosure. The features of the embodiments may be used in any combination without departing from the spirit of the disclosure or conflicting with each other.

Reference will now be made in detail to the exemplary embodiments of the disclosure, examples of which are illustrated in the accompanying drawings. Whenever possible, the same reference numerals are used to represent the same or similar parts in the accompanying drawings and description.

Figure 1B:
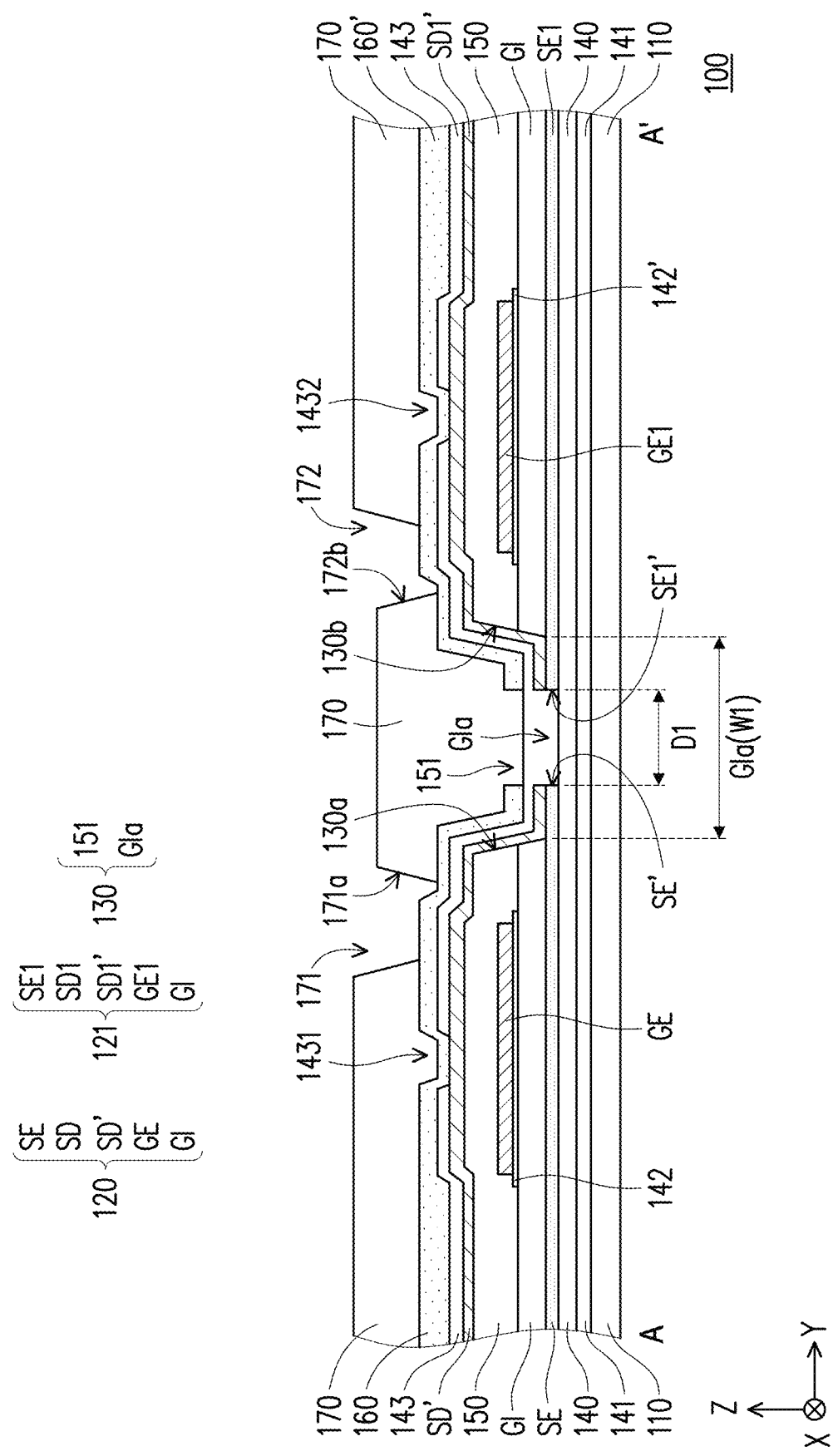
FIG. 1B is a schematic cross-sectional view of the electronic device of FIG. 1A along section line A-A'.

FIG. 1A is a schematic top view of an electronic device according to an embodiment of the disclosure. FIG. 1B is a schematic cross-sectional view of the electronic device of FIG. 1A along section line A-A'. For clarity of the drawings and convenience of description, some components of the electronic device are not shown in FIG. 1A.

Referring to FIG. 1A and FIG. 1B, an electronic device 100 includes a substrate 110, a plurality of transistors 120, 121, 122, 123, 124 and 125 (6 transistors are schematically depicted in FIG. 1A, but not limited thereto) and a plurality of drain contact holes 130 (one drain contact hole is schematically depicted in FIG. 1A, but not limited thereto). The substrate 110 may include a rigid substrate, a flexible substrate, or a combination thereof. For example, the material of the substrate 110 may include glass, quartz, sapphire, ceramic, polycarbonate (PC), polyimide (PI), polyethylene terephthalate (PET), other suitable substrate materials, or a combination of the above, but not limited thereto.

The transistors 120, 121, 122, 123, 124 and 125 are disposed on the substrate 110. The transistor 120, the transistor 122 and the transistor 124 are sequentially arranged along a direction X (e.g., an extending direction of a scan line SL) and adjacent to each other; the transistor 121, the transistor 123 and the transistor 125 are sequentially arranged along the direction X and adjacent to each other; the transistor 120 and the transistor 121 are sequentially arranged along a direction Y (e.g., an extending direction of a data line DL) and adjacent to each other; the transistor 122 and the transistor 123 are sequentially arranged along the direction Y and adjacent to each other; and the transistor 124 and the transistor 125 are sequentially arranged along the direction Y and adjacent to each other (the transistors being adjacent to each other means that there is no other transistor between the two transistors in the direction X or in the direction Y). In addition, in the top view of the electronic device 100 of this embodiment (as shown in FIG. 1A), the electronic device 100 further includes a plurality of sub-pixels P0, P1, P2, P3, P4 and P5. Among them, the transistor 120 is disposed corresponding to the sub-pixel P0; the transistor 121 is disposed corresponding to the sub-pixel P1; the transistor 122 is disposed corresponding to the sub-pixel P2; the transistor 123 is disposed corresponding to the sub-pixel P3; the transistor 124 is disposed corresponding to the sub-pixel P4; and the transistor 125 is disposed corresponding to the sub-pixel P5. For descriptive convenience, the transistor 120 and the transistor 121 are taken as an example below.

In this embodiment, each transistor 120 (or 121) has a semiconductor SE (or SE1), a source SD (or SD1), a drain SD' (or SD1'), a gate GE (or GE1) and a portion of a gate insulation layer GI. A portion of the scan line SL overlapping with the semiconductor SE may be defined as the gate GE. In the schematic top view of the electronic device 100 of this embodiment (as shown in FIG. 1A), the semiconductor SE of the transistor 120 and the semiconductor SE1 of the transistor 121 adjacent in the direction Y are in the same layer. One end of the semiconductor SE and one end of the semiconductor SE1 are connected together and partially overlap with the data line DL. The other end of the semiconductor SE has a side SE'. The side SE' is located between two adjacent data lines DL. An extension direction of the side SE' is substantially parallel to the direction X. The other end of the semiconductor SE1 has a side SE1'. The side SE1' is also located between two adjacent data lines DL. An extension direction of the side SE1' is substantially parallel to the direction X. The side SE' and the side SE1' are separated from each other in the direction Y. In detail, a distance D1 is provided between the side SE' and the side SE1' in the direction Y. Accordingly, the semiconductors of the disclosure form an outline similar to a "C" shape. The outline of the semiconductor may be different from a "C" shape, for example a "U" shape, but not limited thereto. Referring to the schematic cross-sectional view of the electronic device 100 of this embodiment (as shown in FIG. 1), when the side SE' of the semiconductor SE and the side SE1' of the semiconductor SE1 are separated from each other, a portion of a buffer layer 140 is exposed. In this embodiment, the drain SD' (or SD1') overlaps with the scan line SL in the top view of the electronic device 100 (as shown in FIG. 1A)

and in the cross-sectional view of the electronic device 100 (as shown in FIG. 1B). In this embodiment, the material of the semiconductors SE and SE1 may include amorphous silicon, low temperature polysilicon (LTPS), metal oxide (e.g., indium gallium zinc oxide (IGZO)), other suitable materials, or a combination of the above, but not limited thereto. In other embodiments, different transistors may include different semiconductor materials, but not limited thereto.

Referring to the schematic cross-sectional view of the electronic device 100 of this embodiment (as shown in FIG. 1B), in this embodiment, the gate insulation layer GI is disposed on the semiconductor SE (or SE1) and has an opening GIa. A width W1 at the bottom of the opening GIa can be greater than the distance D1 between the side SE' of the semiconductor SE and the side SE1' of the semiconductor SE1, so that the opening GIa can expose a portion of the semiconductor SE (or SE1) and a portion of the buffer layer 140. In this embodiment, the width W1 is, for example, a maximum width of the opening GIa measured along the direction Y, and the distance D1 is, for example, a maximum distance between the side SE' of the semiconductor SE and the side SE1' of the semiconductor SE1 measured along the direction Y.

In this embodiment, the gate GE of the transistor 120 and the gate GE1 of the transistor 121 are respectively disposed on the gate insulation layer GI. The source SD and the drain SD' of the transistor 120 are respectively disposed on the gate GE, and the source SD1 and the drain SD1' of the transistor 121 are also respectively disposed on the gate GE1. The drain SD' and the drain SD1' are disposed on the substrate 110 and overlapped with the semiconductor SE and the semiconductor SE1 respectively in the top view of the electronic device 100. In this embodiment, the material of the sources SD and SD1 and/or the drains SD' and SD1' may include a transparent conductive material or a non-transparent conductive material, such as indium tin oxide, indium zinc oxide, indium oxide, zinc oxide, tin oxide, a metal material (e.g., aluminum, molybdenum, copper, silver), other suitable materials, or a combination of the above, but not limited thereto.

In the schematic top view of the electronic device 100 of this embodiment (as shown in FIG. 1A), the electronic device 100 further includes the scan line SL for transmitting scan signal and the data line DL for transmitting data signal. The scan line SL and the data line DL are disposed on the substrate 110. The scan line SL substantially extends along the direction X, and the data line DL substantially extends along the direction Y. A normal direction of the substrate 110 is a direction Z. The direction X, the direction Y, and the direction Z are different from each other, and the direction X, the direction Y, and the direction Z are perpendicular to each other. The source SD (or SD1) of the transistor 120 (or 121) can be electrically connected to the data line DL, and the gate GE (or GE1) of the transistor 120 (or 121) can be electrically connected to the scan line SL. Therefore, the transistor 120 (or 121) can be electrically connected to the data line DL and the scan line SL. The source SD (or SD1), the drains SD' (or SD1') and the data line DL are in the same layer. In addition, in the top view of this embodiment, a portion of the data line DL extends into the drain contact hole 130, and a width of the data line DL extending into the drain contact hole 130 is W2. A width of another portion of the data line DL disposed outside the drain contact hole 130 is W3, and the width W3 is, for example, less than or equal to W2, but not limited thereto. In some embodiments, 2 times the width W3 may be greater than the width W2. In some embodiments, 1.7 times the width W3 may be greater than the width W2. In some embodiments, 1.3 times the width W3 may be greater than the width W2. In this embodiment, the width W2 is, for example, a maximum width of the data line DL inside the drain contact hole 130 from one side to the other side of the data line DL measured along the direction X. The width W3 is, for example, a maximum width of the data line DL outside the drain contact hole 130 from one side to the other side of the data line DL measured along the direction X.

Referring to FIG. 1A and FIG. 1B together, in this embodiment, the electronic device 100 further includes the buffer layer 140, a shielding layer 141, insulation layers 142 and 142', an insulation layer 143, a dielectric layer 150, transfer pads 160 and 160', an insulation layer 170, a pixel electrode (not shown), a common electrode (not shown) and an intermediate insulation layer (not shown) between the pixel electrode and the common electrode. Among them, the buffer layer 140, the insulation layers 142 and 142', the insulation layer 143, the dielectric layer 150 and the insulation layer 170 can be single-layer or multi-layer structures, and can include, for example, organic materials, inorganic materials or a combination of the above, but not limited thereto. In this embodiment, the material of the shielding layer 141 can be, for example, a metal material or other light shielding materials. In some embodiments, the electronic device may not be provided with the shielding layer (not shown). In some embodiments, the pixel electrode (not shown) and the data line DL are in the different layers.

In this embodiment, the shielding layer 141 is disposed on the substrate 110; the buffer layer 140 is disposed on the shielding layer 141; and the shielding layer 141 and the buffer layer 140 are disposed between the transistors 120 and 121 and the substrate 110. The insulation layer 142 (or 142') is disposed between the gate GE (or GE1) and the gate insulation layer GI, and the insulation layer 142 (or 142') is disposed corresponding to the gate GE (or GE1).

In this embodiment, the dielectric layer 150 is disposed between the drains SD' and SD1' and the gate insulation layer GI to cover the gates GE and GE1 and the gate insulation layer GI. The dielectric layer 150 has an opening 151. The opening 151 communicates with the opening GIa to form the drain contact hole 130 and expose portions of the semiconductors SE and SE1 and a portion of the buffer layer 140. Therefore, in this embodiment, in the extending direction of the data line DL (i.e., the direction Y), the transistor 120 and the transistor 121 (or the transistor 122 and the transistor 123, or the transistor 124 and the transistor 125) are adjacent to each other. The drain contact hole 130 of the electronic device 100 is disposed between the two adjacent transistors 120 and 121 (or the transistors 122 and 123, or the transistors 124 and 125).

In this embodiment, the source SD (or SD1) and the drain SD' (or SD1') can be respectively disposed on the dielectric layer 150. The source SD of the transistor 120 and the source SD1 of the transistor 121 can also be disposed in the drain contact hole 130, so that the source SD and the source SD1 can respectively contact and be electrically connected to semiconductor SE and semiconductor SE1 in the drain contact hole 130. In addition, the drain SD' of the transistor 120 and the drain SD1' of the transistor 121 can also be disposed in the drain contact hole 130, so that the drain SD' and the drain SD1' can respectively contact and be electrically connected to the semiconductor SE and the semiconductor SE1 in the drain contact hole 130. That is to say, the source SD of the transistor 120 and the source SD1 of the transistor 121 can be electrically connected to the semiconductor SE and the semiconductor SE1 through the drain contact hole 130, respectively. Moreover, the drain SD' of the transistor 120 and the drain SD1' of the transistor 121 can also be electrically connected to the semiconductor SE and the semiconductor SE1 through the drain contact hole 130, respectively. That is, the source SD and the drain SD' of the transistor 120 can share the same drain contact hole 130 with the source SD1 and the drain SD1' of the transistor 121 adjacent in the direction Y.

In this embodiment, the drain contact hole of the electronic device is defined as a contact hole for allowing the drain of the transistor to contact and be electrically connected to the semiconductor. Therefore, even if there are other electrodes (e.g., the source) in the contact hole that can contact and be electrically connected to the semiconductor through the contact hole, the contact hole is still defined as the drain contact hole.

In addition, similar to the case of the transistor 120 and the transistor 121, a source SD2 of the transistor 122 and a source SD3 of the transistor 123 can also be electrically connected to a semiconductor SE2 and a semiconductor SE3 respectively through the drain contact hole 130; a drain SD2' of the transistor 122 and a drain SD3' of the transistor 123 can also be electrically connected to the semiconductor SE2 and the semiconductor SE3 respectively through the drain contact hole 130; a source SD4 of the transistor 124 and a source SD5 of the transistor 125 can also be electrically connected to a semiconductor SE4 and a semiconductor SE5 respectively through the drain contact hole 130; and a drain SD4' of the transistor 124 and a drain SD5' of the transistor 125 can also be electrically connected to the semiconductor SE4 and the semiconductor SE5 respectively through the drain contact hole 130. In other words, the source SD and the drain SD' of the transistor 120 can also share the same drain contact hole 130 with the source SD2 and the drain SD2' of the transistor 122 adjacent in the direction X. Accordingly, the source SD and the drain SD' of the transistor 120 in the sub-pixel P0, the source SD1 and the drain SD1' of the transistor 121 in the sub-pixel P1, the source SD2 and the drain SD2' of the transistor 122 in the sub-pixel P2, the source SD3 and the drain SD3' of the transistor 123 in the sub-pixel P3, the source SD4 and the drain SD4' of the transistor 124 in the sub-pixel P4, and the source SD5 and the drain SD5' of the transistor 125 in the sub-pixel P5 can all share the same drain contact hole 130 to be electrically connected to the corresponding semiconductors SE, SE1, SE2, SE3, SE4 and SE5. The semiconductor SE and the semiconductor SE1 are arranged along the direction Y, the semiconductor SE2 and the semiconductor SE3 are arranged along the direction Y, and the semiconductor SE4 and the semiconductor SE5 are also arranged along the direction Y.

Therefore, in this embodiment, the drains SD', SD1', SD2', SD3', SD4' and SD5' and the sources SD, SD1, SD2, SD3, SD4 and SD5 of at least two transistors 120, 121, 122, 123, 124 and 125 among the transistors 120, 121, 122, 123, 124 and 125 can share one drain contact hole 130 among the drain contact holes (not shown). Accordingly, a number of the drain contact holes 130 can be less than a number of the drains SD', SD1', SD2', SD3', SD4' and SD5' (or a number of the sources SD, SD1, SD2, SD3, SD4 and SD5) to prevent the electronic device (e.g., a high-resolution display device, but not limited thereto) from cracking in the subsequent formation of stacked layers due to steep topography in the contact holes caused by the excessive number of the contact holes. In this way, the layout of metal lines and thin film transistor units in the display panel can be improved.

In this embodiment, the insulation layer 143 is disposed on the transistors 120 and 121 to cover the sources SD and SD1, the drains SD' and SD1' and the dielectric layer 150. The insulation layer 143 is disposed between the transfer pads 160 and 160' and the drains SD' and SD1'. The insulation layer 143 can also be disposed in the drain contact hole 130 to cover the drains SD' and SD1' and the portion of the buffer layer 140 exposed by the opening GIa of the gate insulation layer GI. In addition, the insulation layer 143 has a first opening 1431 and a second opening 1432 to respectively expose a portion of the drain SD' and a portion of the drain SD1'.

In this embodiment, the transfer pad 160 and the transfer pad 160' are arranged corresponding to the drain SD' and the drain SD1', respectively. Specifically, the transfer pads 160 and 160' are disposed on the insulation layer 143 and in the drain contact hole 130. The transfer pad 160 can also be disposed in the first opening 1431 of the insulation layer 143, so that the transfer pad 160 can be electrically connected to the drain SD' through the first opening 1431 of the insulation layer 143. The transfer pad 160' can also be disposed in the second opening 1432 of the insulation layer 143, so that the transfer pad 160' can be electrically connected to the drain SD1' through the second opening 1432 of the insulation layer 143. In the drain contact hole 130, the transfer pad 160 and the transfer pad 160' are separated from each other to expose a portion of the insulation layer 143. In this embodiment, the material of the transfer pads 160 and 160' may also include a metal material or a transparent conductive material. The metal material may include molybdenum, aluminum, titanium, copper, other suitable metals, or alloys or combinations of the materials above, but not limited thereto. The transparent conductive material may include indium tin oxide or indium zinc oxide, but not limited thereto.

In this embodiment, the insulation layer 170 is disposed on the transfer pads 160 and 160' and in the drain contact hole 130. In the drain contact hole 130, the insulation layer 170 can cover the transfer pads 160 and 160' and a portion of the insulation layer 143 exposed by the transfer pads 160 and 160'. The insulation layer 170 has a third opening 171 and a fourth opening 172 to respectively expose a portion of the transfer pad 160 and a portion of the transfer pad 160'. In addition, in the top view of the electronic device 100 (as shown in FIG. 1A), the third opening 171 of the insulation layer 170 and the drain contact hole 130 are separated from each other and have a distance D2, and the fourth opening 172 of the insulation layer 170 and the drain contact hole 130 are also separated from each other and has a distance D3. In detail, in the top view of this embodiment (as shown in FIG. 1A), the distance D2 is, for example, a maximum distance between one side 171a of the third opening 171 and one side 130a of the drain contact hole 130 measured along the direction Y, and the distance D3 is, for example, a maximum distance between one side 172b of the fourth opening 172 and the other side 130b of the drain contact hole 130 measured along the direction Y. Extending directions of the side 171a and the side 172b are substantially parallel to the direction X (i.e., parallel to the extending direction of the scan line SL), and the side 171a and the side 172b are closest to each other. The distance between two openings/holes means the distance from a bottom of one opening to a bottom of another opening.

Further, in this embodiment, an orthographic projection of the third opening 171 (or the fourth opening 172) of the insulation layer 170 in the normal direction of the substrate 110 (i.e., the direction Z) does not overlap with an orthographic projection of the drain contact hole 130 in the normal direction of the substrate 110. Specifically, the third opening 171 of the insulation layer 170 has a sidewall 171a adjacent to the drain contact hole 130; the fourth opening 172 of the insulation layer 170 has a sidewall 172b adjacent to the drain contact hole 130, and the drain contact hole 130 has a sidewall 130a adjacent to the third opening 171 and a sidewall 130b adjacent to the fourth opening 172. An orthographic projection of the sidewall 171a of the third opening 171 in the normal direction of the substrate 110 (i.e., direction Z) does not overlap with an orthographic projection of the sidewall 130a of the drain contact hole 130 in the normal direction of the substrate 110, and an orthographic projection of the sidewall 172b of the fourth opening 172 in the normal direction of the substrate 110 does not overlap with an orthographic projection of the sidewall 130b of the drain contact hole 130 in the normal direction of the substrate 110.

In this embodiment, the third opening 171 (or the fourth opening 172) of the insulation layer 170 does not overlap with the drain contact hole 130 and the third opening 171 (or the fourth opening 172) of the insulation layer 170, is separated from the drain contact hole 130 and has the distance D2 (or the distance D3). The orthographic projection of the sidewall 171a of the third opening 171 (or the sidewall 172b of the fourth opening 172) in the direction Z does not overlap with the orthographic projection of the sidewall 130a (or the sidewall 130b) of the drain contact hole 130 in the direction Z. Therefore, a relatively flat topography can be provided to prevent the intermediate insulation layer (not shown) subsequently disposed on the insulation layer 170 between the pixel electrode and the common electrode from cracking. Accordingly, the risk of short circuit caused by the pixel electrode in contact with the common electrode due to cracking of the intermediate insulation layer can be reduced.

Figure 5A:
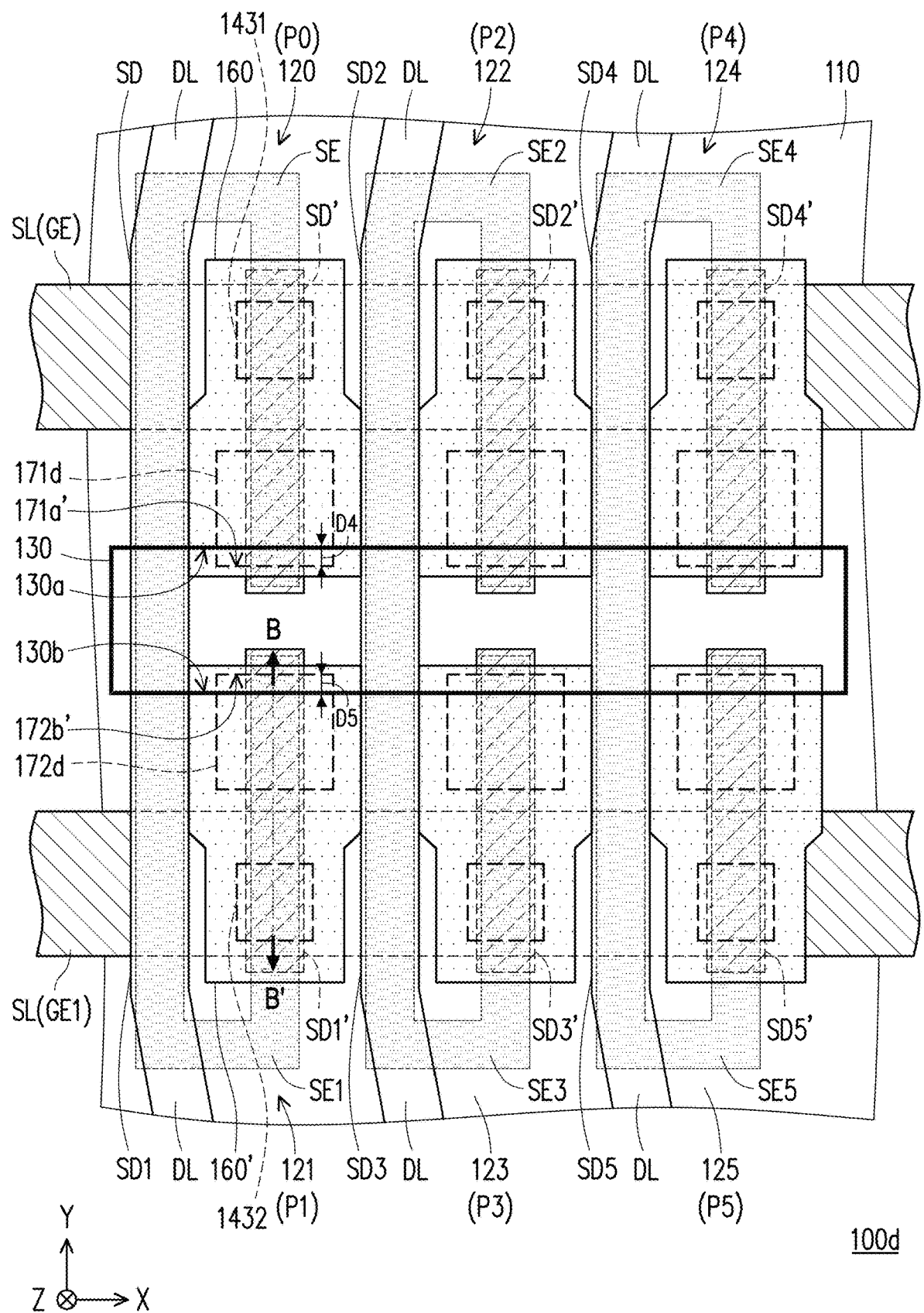
FIG. 5A is a schematic top view of an electronic device according to another embodiment of the disclosure.
Figure 5B:
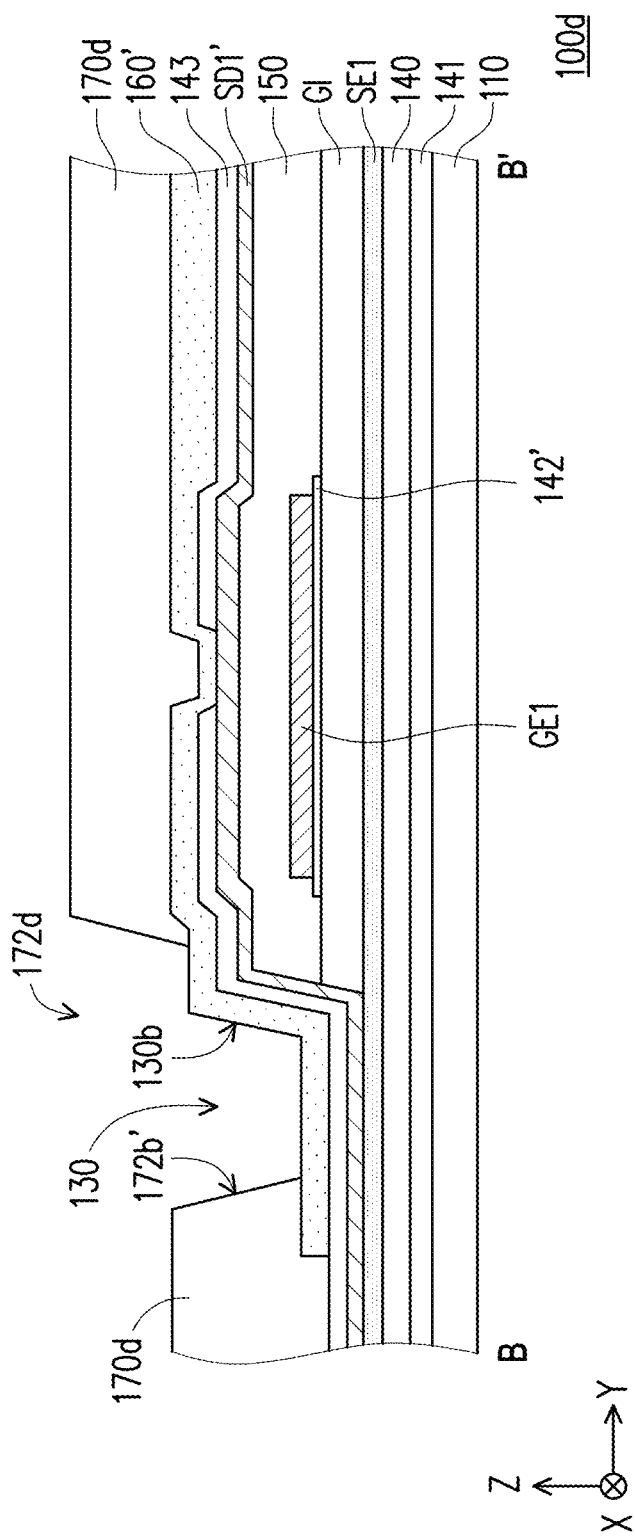
FIG. 5B is a schematic cross-sectional view of the electronic device of FIG. 5A along section line B-B'.

In the top view of the electronic device 100 of this embodiment, although the third opening 171 (or the fourth opening 172) of the insulation layer 170 and the drain contact hole 130 are separated from each other, the disclosure is not limited thereto. In some embodiments, the third opening 171 (or the fourth opening 172) of the insulation layer 170 may also partially overlap with the drain contact hole 130 (as shown in FIG. 5A and FIG. 5B), as long as the orthographic projection of the sidewall 171a of the third opening 171 (or the sidewall 172b of the fourth opening 172) in the direction Z does not overlap with the orthographic projection of the sidewall 130a (or the sidewall 130b) of the drain contact holes 130 in the direction Z.

Figure 2:
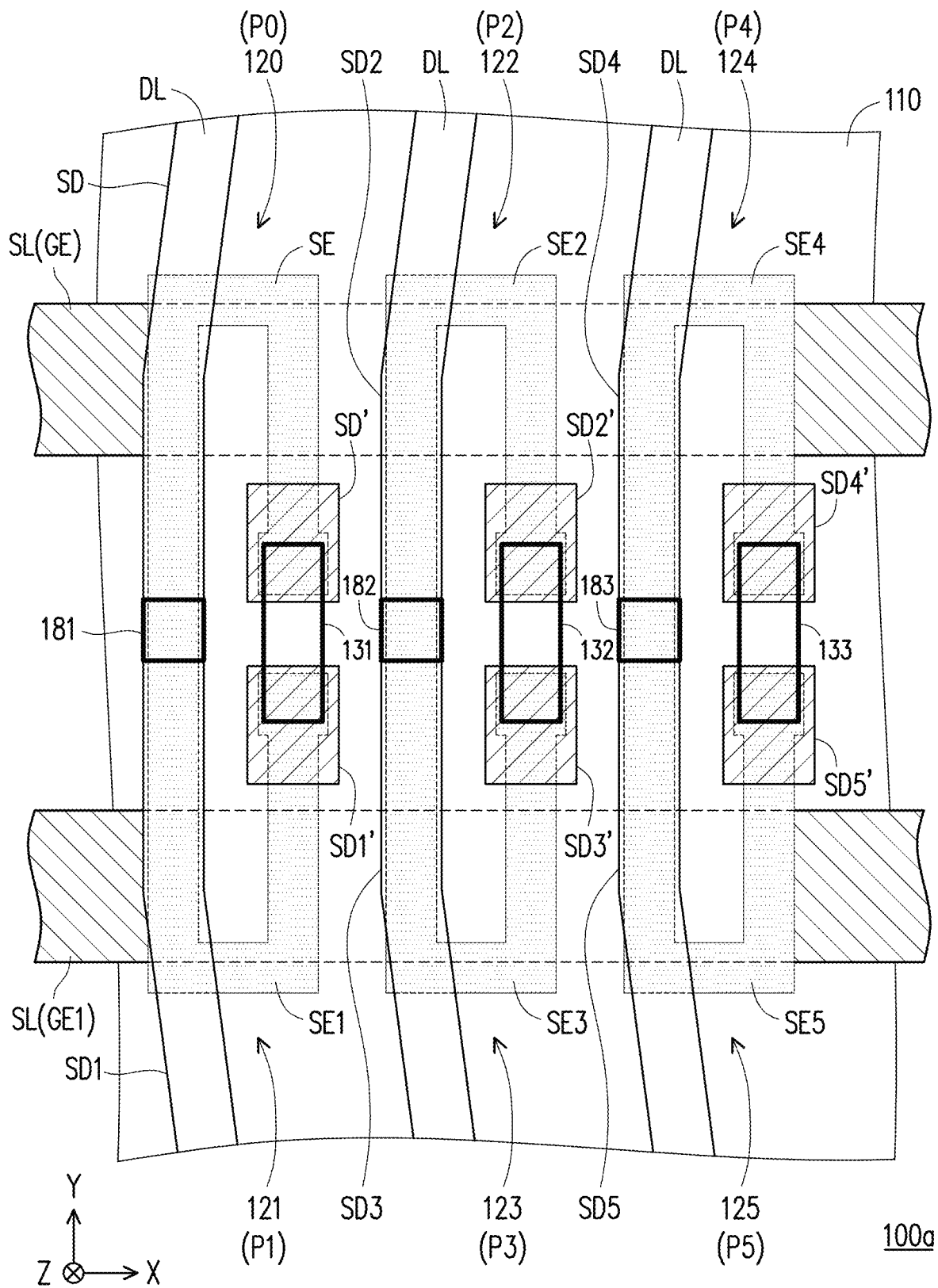
FIG. 2 is a schematic top view of an electronic device according to another embodiment of the disclosure.
Figure 3:
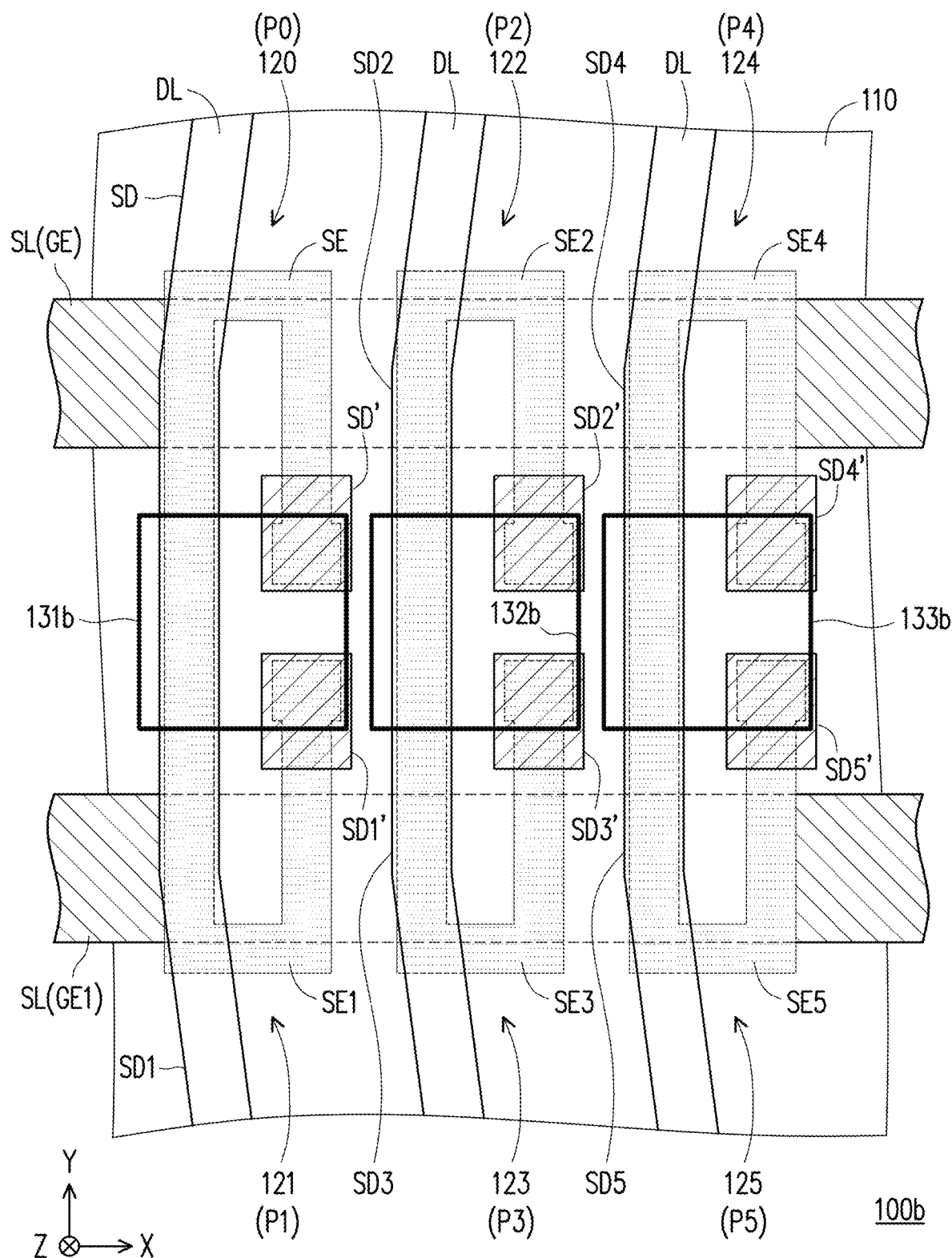
FIG. 3 is a schematic top view of an electronic device according to another embodiment of the disclosure.
Figure 4:
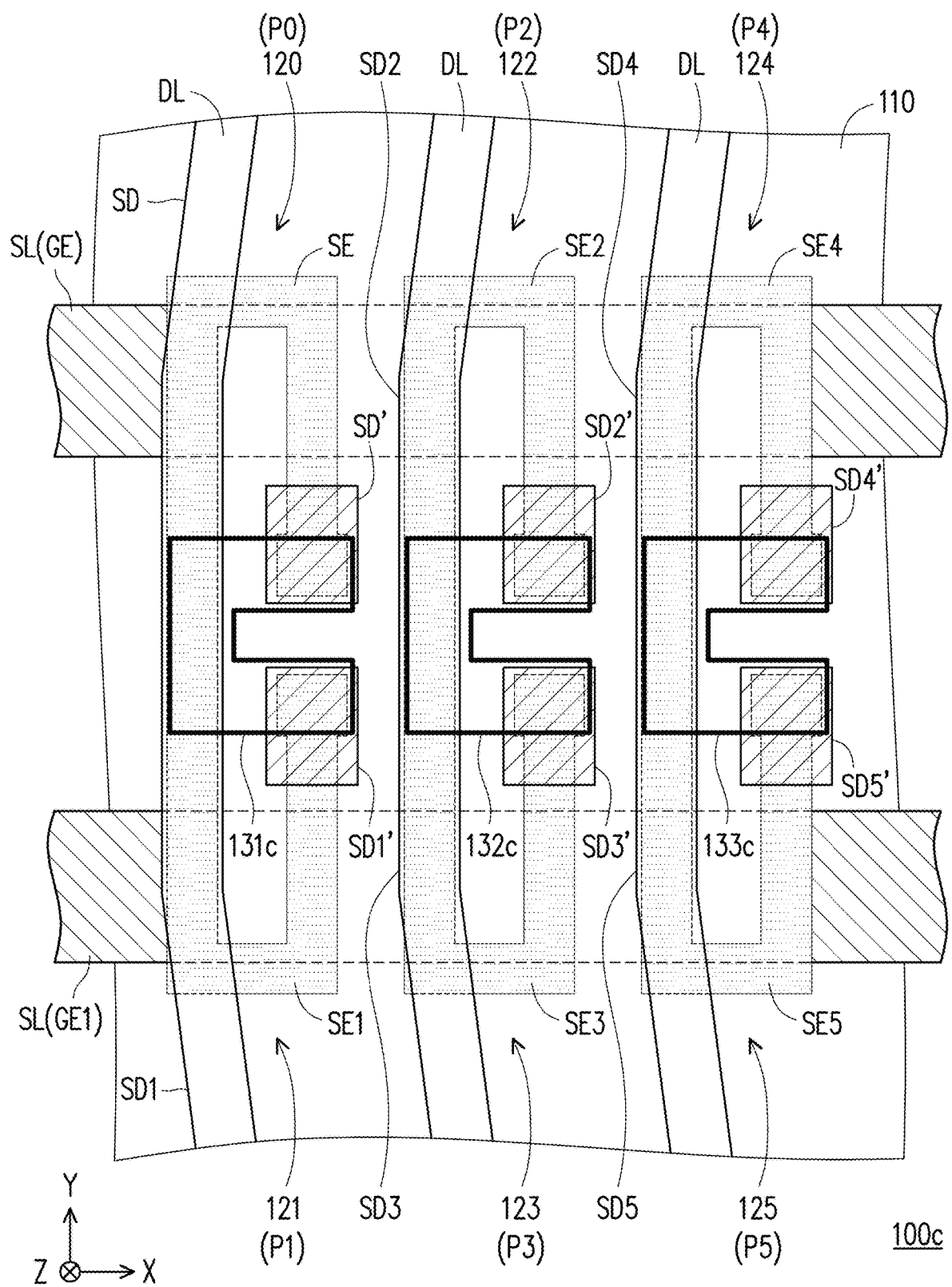
FIG. 4 is a schematic top view of an electronic device according to another embodiment of the disclosure.

In the top view of the electronic device 100 of this embodiment, the source SD and the drain SD' of the transistor 120 can share the same drain contact hole 130 with the source SD1 and the drain SD1' of the transistor 121 adjacent in the direction Y, and the source SD and the drain SD' of the transistor 120 can also share the same drain contact hole 130 with the source SD2 and the drain SD2' of the transistor 122 adjacent in the direction X. However, the disclosure does not limit a coverage of the drain contact holes, as long as the number of the drain contact holes in the electronic device is less than the number of the drains. That is to say, in some embodiments, the coverage of the drain contact hole may only be shared the source and the drain of two adjacent transistors in the direction Y, as shown in FIG. 3 and FIG. 4. In some embodiments, the coverage of the drain contact hole may only be shared by the drains of two adjacent transistors in the direction Y, as shown in FIG. 2.

In addition, in the electronic device 100 of this embodiment, in the direction Y, the pixel electrodes (not shown) in any two adjacent sub-pixels P0 and P1 (or the sub-pixels P2 and P3, or the sub-pixels P4 and P5) are disposed in a back-to-back manner, for example. The so-called "back-to-back manner" in the disclosure refers to a configuration in which the source and the drain of the transistors of two adjacent sub-pixels are shared in the direction Y, but not limited thereto.

In short, in the electronic device 100 of the present embodiment of the disclosure, by disposing the drain contact hole 130 between two adjacent transistors 120 and 121 (or the transistors 122 and 123, or the transistors 124 and 125), the drains SD' and SD1' (or the drains SD2' and SD3', of the drains SD4' and SD5') of the two adjacent transistors 120 and 121 (or the transistors 122 and 123, or the transistors 124 and 125) can be electrically connected to the corresponding semiconductors SE and SE1 (or the semiconductors SE2 and SE3, or the semiconductors SE4 and SE5) together through the same drain contact hole 130. Accordingly, the number of the drain contact holes 130 can be less than the number of the drains SD', SD1', SD2', SD3', SD4' and SD5'. In this way, the electronic device 100 (e.g., a high-resolution display device, but not limited thereto) may be prevented from cracking in the subsequent formation of stacked layers due to steep topography in the contact holes caused by the excessive number of the contact holes. In addition, the orthographic projection of the sidewall 171a (or the sidewall 172b) of the third opening 171 (or the fourth opening 172) adjacent to the drain contact hole 130 in the normal direction of the substrate 110 (the direction Z) does not overlap with the orthographic projection of the sidewall 130a (or the sidewall 130b) of the drain contact hole 130 adjacent to the third opening 171 (or the fourth opening 172) in the normal direction of the substrate 110. Therefore, a relatively flat topography can be provided to prevent the intermediate insulation layer subsequently disposed on the insulation layer 170 between the pixel electrode and the common electrode from cracking. Accordingly, the risk of short circuit caused by the pixel electrode in contact with the common electrode due to cracking of the intermediate insulation layer can be avoided. In this way, the electronic device 100 of the embodiment of the disclosure has better reliability or better display quality.

Other embodiments will be provided below for description. It is noted herein that the reference numerals and part of the descriptions of the above embodiment apply to the following embodiments, where the same numerals are used to represent the same or similar components, and descriptions of the same technical contents are omitted. Reference may be made to the above embodiment for the descriptions of the omitted contents, which will not be repeated in the following embodiments.

FIG. 2 is a schematic top view of an electronic device according to another embodiment of the disclosure. For clarity of the drawings and convenience of description, FIG. 2 omits several elements in the electronic device. For example, the scan line, the transfer pad, the first opening, the second opening, the third opening and the fourth opening are omitted, but not limited thereto. Referring to FIG. 1A and FIG. 2 together, an electronic device 100a of this embodiment is substantially similar to the electronic device 100 of FIG. 1A, so the same and similar components in the two embodiments will not be repeatedly described herein. The electronic device 100a of this embodiment is different from the electronic device 100 mainly in that the electronic device 100a of this embodiment includes drain contact holes 131, 132 and 133 and source contact holes 181, 182 and 183, and the drain contact hole 131, the drain contact hole 132 and the drain contact hole 133 are separated from each other and not connected.

Specifically, referring to FIG. 2, in the top view of the electronic device 100a of this embodiment, the source SD of the transistor 120 shares the source contact hole 181 with the source SD1 of the transistor 121 adjacent in the direction Y; the drain SD' of the transistor 120 shares the drain contact hole 131 with the drain SD1' of the transistor 121 adjacent in the direction Y; and the source contact hole 181 and the drain contact hole 131 are separated from each other. The source SD2 of the transistor 122 shares the source contact hole 182 with the source SD3 of the transistor 123 adjacent in the direction Y; The drain SD2' of the transistor 122 shares the drain contact hole 132 with the drain SD3' of the transistor 123 adjacent in the direction Y; and the source contact hole 182 and the drain contact hole 132 are separated from each other. The source SD4 of the transistor 124 shares the source contact hole 183 with the source SD5 of the transistor 125 adjacent in the direction Y; the drain SD4' of the transistor 124 shares the drain contact hole 133 with the drain SD5' of the transistor 125 adjacent in the direction Y; and the source contact hole 183 and the drain contact hole 133 are separated from each other.

In this embodiment, at least two of the plurality of transistors 120 and 121 (or the transistors 122 and 123, or the transistors 124 and 125) share one of the plurality of drain contact holes 131 (or the drain contact hole 132, or the drain contact hole 133) with the drain electrodes SD' and SD1' (or the drains SD2' and SD3', or the drains SD4' and SD5'), in details, the drains SD' and SD1' (or the drains SD2' and SD3', or the drains SD4' and SD5') of at least two transistors 120 and 121 (or the transistors 122 and 123, or the transistors 124 and 125) among the transistors 120, 121, 122, 123, 124 and 125 can share one drain contact hole 131 (or the drain contact hole 132, or the drain contact hole 133) among the drain contact holes 131, 132 and 133. Therefore, the drains SD' and SD1' (or the drains SD2' and SD3', or the drains SD4' and SD5') can be electrically connected to the semiconductors SE and SE1 (or the semiconductors SE2 and SE3, or the semiconductors SE4 and SE5) through the drain contact hole 131 (or the drain contact hole 132, or the drain contact hole 133). Here, the number of the drain contact holes 131, 132 and 133 can be less than the number of the drains SD', SD1', SD2', SD3', SD4' and SD5'. The number of the source contact holes 181, 182 and 183 can also be less than the number of the sources SD, SD1, SD2, SD3, SD4 and SD5.

FIG. 3 is a schematic top view of an electronic device according to another embodiment of the disclosure. For clarity of the drawings and convenience of description, FIG. 3 omits several elements in the electronic device. For example, the scan line, the transfer pad, the first opening, the second opening, the third opening and the fourth opening are omitted, but not limited thereto. Referring to FIG. 1A and FIG. 3 together, an electronic device 100b of this embodiment is substantially similar to the electronic device 100 of FIG. 1A, so the same and similar components in the two embodiments will not be repeatedly described herein. The electronic device 100b of this embodiment is different from the electronic device 100 mainly in that the electronic device 100b of this embodiment includes drain contact holes 131b, 132b and 133b, and the drain contact hole 131b, the drain contact hole 132b and the drain contact hole 133b are separated from each other and not connected.

Specifically, referring to FIG. 3, in the top view of the electronic device 100b of this embodiment, the source SD and the drain SD' of the transistor 120 can share the drain contact hole 131b with the source SD1 and the drain SD1' of the transistor 121 adjacent in the direction Y. The source SD2 and drain SD2' of the transistor 122 can share the drain contact hole 132b with the source SD3 and the drain SD3' of the transistor 123 adjacent in the direction Y. The source SD4 and the drain SD4' of the transistor 124 can share the drain contact hole 133b with the source SD5 and the drain SD5' of the transistor 125 adjacent in the direction Y.

In this embodiment, at least two of the plurality of transistors 120 and 121 (or the transistors 122 and 123, or the transistors 124 and 125) share one of the plurality of drain contact holes 131b (or the drain contact hole 132b, or the drain contact hole 133b) with the drain electrodes SD' and SD1' (or the drains SD2' and SD3', or the drains SD4' and SD5') and the source electrodes SD and SD1 (or the sources SD2 and SD3, or the sources SD4 and SD5), in details, the drains SD' and SD1' (or the drains SD2' and SD3', or the drains SD4' and SD5') and the sources SD and SD1 (or the sources SD2 and SD3, or the sources SD4 and SD5) of at least two transistors 120 and 121 (or the transistors 122 and 123, or the transistors 124 and 125) among the transistors 120, 121, 122, 123, 124 and 125 can share one drain contact hole 131b (or the drain contact hole 132b, or the drain contact hole 133b) among the drain contact holes 131b, 132b and 132b. Therefore, the drains SD' and SD1' (or the drains SD2' and SD3', or the drains SD4' and SD5') can be electrically connected to the semiconductors SE and SE1 (or the semiconductors SE2 and SE3, or the semiconductors SE4 and SE5) through the drain contact hole 131b (or the drain contact hole 132b, or the drain contact hole 133b). Here, the number of the drain contact holes 131b, 132b and 133b can be less than the number of the drains SD', SD1', SD2', SD3', SD4' and SD5'. The number of the drain contact holes 131b, 132b and 133b can also be less than the number of the sources SD, SD1, SD2, SD3, SD4 and SD5.

In addition, in the top view of the electronic device 100b of this embodiment, although outlines of the drain contact holes 131b, 132b and 133b are quadrilateral, the disclosure does not limit the outlines of the drain contact holes. That is to say, in some embodiments, the contour of the drain contact hole may also be, for example, a C-shape (as shown in FIG. 4) or other suitable contours, as long as the sources and the drains of two transistors adjacent in the direction Y can share one drain contact hole to be electrically connected to the corresponding semiconductors.

FIG. 4 is a schematic top view of an electronic device according to another embodiment of the disclosure. Referring to FIG. 3 and FIG. 4 together, an electronic device 100c of this embodiment is substantially similar to the electronic device 100b of FIG. 3, so the same and similar components in the two embodiments will not be repeatedly described herein. The electronic device 100c of this embodiment is different from the electronic device 100b mainly in that, in the top view of the electronic device 100c of this embodiment, outlines of drain contact holes 131c, 132c and 133c are C-shaped.

FIG. 5A is a schematic top view of an electronic device according to another embodiment of the disclosure. FIG. 5B is a schematic cross-sectional view of the electronic device of FIG. 5A along section line B-B'. Referring to FIGS. 1A to 1B and FIGS. 5A to 5B together, an electronic device 100d of this embodiment is substantially similar to the electronic device 100 of FIGS. 1A to 1B, so the same and similar components in the two embodiments will not be repeatedly described herein. The electronic device 100d of this embodiment is different from the electronic device 100 mainly in that, in the top view of the electronic device 100d of this embodiment, the third opening 171d (or a fourth opening 172d) of an insulation layer 170d in the normal direction of the substrate 110 (i.e., the direction Z) partially overlaps with the drain contact hole 130 in the normal direction of the substrate 110, and the fourth opening 172d of an insulation layer 170d in the normal direction of the substrate 110 partially overlaps with the drain contact hole 130 in the normal direction of the substrate 110.

Specifically, referring to FIG. 5A and FIG. 5B, in this embodiment, the third opening 171d of the insulation layer 170d has a sidewall 171a' adjacent to the drain contact hole 130; the fourth opening 172d of the insulation layer 170d has a sidewall 172b' adjacent to the drain contact hole 130; and the drain contact hole 130 has the sidewall 130a adjacent to the third opening 171d and the sidewall 130b adjacent to the fourth opening 172d. An orthographic projection of the sidewall 171a' of the third opening 171d in the normal direction of the substrate 110 (i.e., direction Z) does not overlap with the orthographic projection of the sidewall 130a of the drain contact hole 130 in the normal direction of the substrate 110, and an orthographic projection of the sidewall 172b' of the fourth opening 172d in the normal direction of the substrate 110 does not overlap with the orthographic projection of the sidewall 130b of the drain contact hole 130 in the normal direction of the substrate 110. A distance D4 is provided between the sidewall 171a' of the third opening 171d and the sidewall 130a of the drain contact hole 130, and a distance D5 is provided between the sidewall 172b' of the fourth opening 172d and the sidewall 130b of the drain contact hole 130. In this embodiment, the distance D4 is, for example, a maximum between the sidewall 171a' of the third opening 171d and the sidewall 130a of the drain contact hole 130 measured along the direction Y. The distance D5 is, for example, a maximum distance between the sidewall 172b' of the fourth opening 172d and the sidewall 130b of the drain contact hole 130 measured along the direction Y.

In this embodiment, the orthographic projection of the sidewall 171a' of the third opening 171d (or the sidewall 172b' of the fourth opening 172d) in the normal direction of the substrate 110 does not overlap with the orthographic projection of the sidewall 130a (or the sidewall 130b) of the drain contact hole 130 in the normal direction of the substrate 110. Therefore, a relatively flat topography can be provided to prevent the intermediate insulation layer (not shown) subsequently disposed on the insulation layer 170d between the pixel electrode and the common electrode from cracking. Accordingly, the risk of short circuit caused by the pixel electrode in contact with the common electrode due to cracking of the intermediate insulation layer can be avoided. Conversely, when the orthographic projection of the sidewall of the third opening adjacent the drain contact hole (or the sidewall of the fourth opening adjacent to the drain contact hole) in the normal direction of the substrate 110 overlaps with an orthographic projection (not shown) of the drain contact hole adjacent to the sidewall of the third opening (or adjacent to the sidewall of the fourth opening) in the normal direction of the substrate 110, an invert taper topography may appear. Therefore, the intermediate insulation layer (not shown) subsequently disposed on the insulation layer and located between the pixel electrode and the common electrode may be cracked, thereby causing the pixel electrode to contact the common electrode and causing a short circuit.

Figure 6:
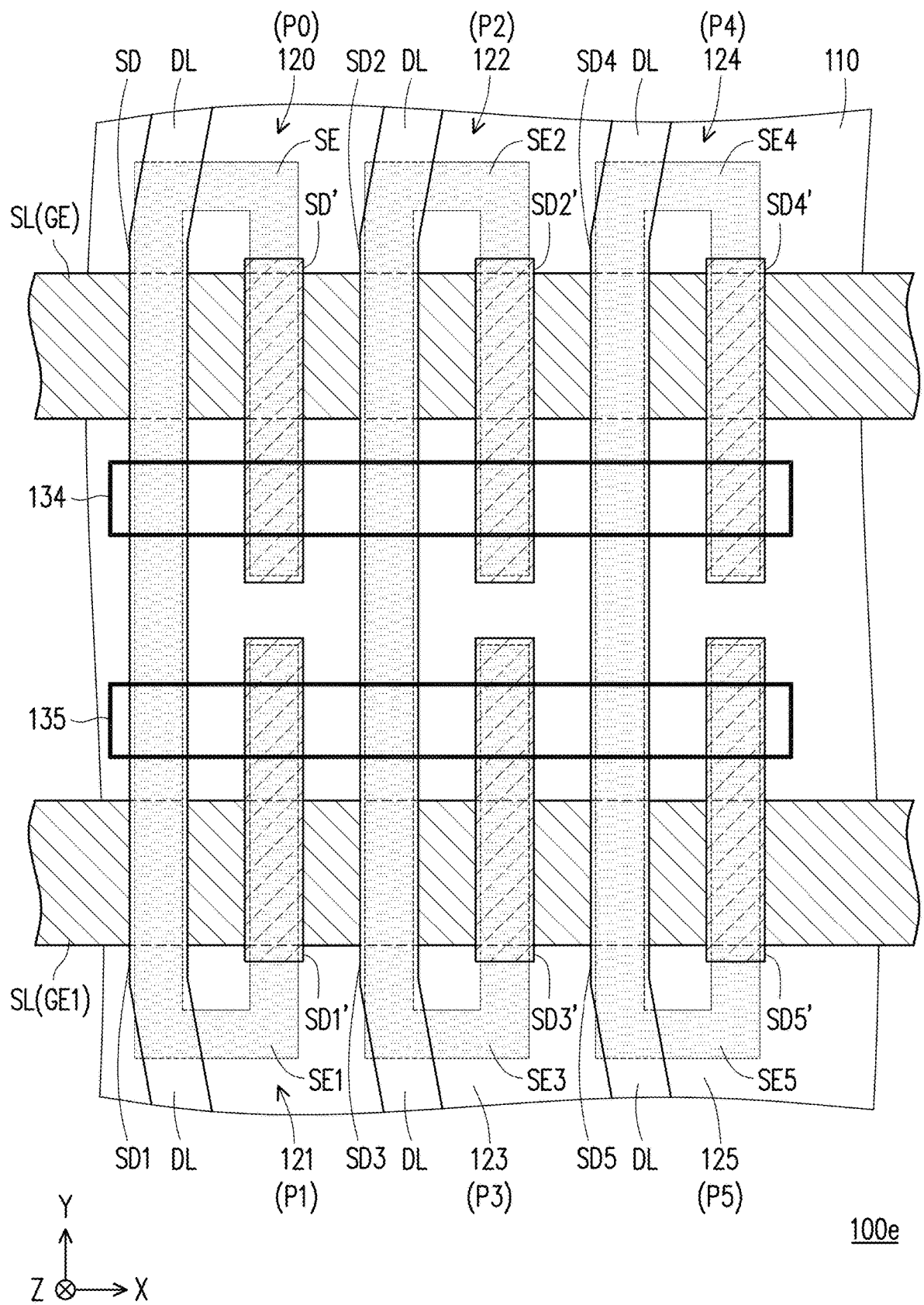
FIG. 6 is a schematic top view of an electronic device according to another embodiment of the disclosure.

FIG. 6 is a schematic top view of an electronic device according to another embodiment of the disclosure. For clarity of the drawings and convenience of description, FIG. 6 omits several elements in the electronic device. For example, the scan line, the transfer pad, the first opening, the second opening, the third opening and the fourth opening are omitted, but not limited thereto. Referring to FIG. 1A and FIG. 6 together, an electronic device 100e of this embodiment is substantially similar to the electronic device 100 of FIG. 1A, so the same and similar components in the two embodiments will not be repeatedly described herein. The electronic device 100e of this embodiment is different from the electronic device 100 mainly in that the electronic device 100e of this embodiment includes drain contact holes 134 and 135, and the drain contact hole 134 and the drain contact hole 135 are separated from each other and not connected.

Specifically, referring to FIG. 6, in the top view of the electronic device 100e of this embodiment, among the transistor 120, the transistor 122 and the transistor 124 arranged adjacent to each other in the direction X, the source SD and the drain SD' of the transistor 120, the source SD2 and the drain SD2' of the transistor 122 and the source SD4 and the drain SD4' of the transistor 124 share the same drain contact hole 134. Further, among the transistor 121, the transistor 123 and the transistor 125 arranged adjacent to each other in the direction X, the source SD1 and the drain SD1' of the transistor 121, the source SD3 and the drain SD3' of the transistor 123 and the source SD5 and the drain SD5' of the transistor 125 share the same drain contact hole 135.

In summary, in the electronic device according to the embodiments of the disclosure, by disposing the drain contact hole between two adjacent transistors, the drains of the two adjacent transistors can be electrically connected to the corresponding semiconductors together through the same drain contact hole. Accordingly, the number of the drain contact holes can be less than the number of the drains. In this way, the electronic device (e.g., a high-resolution display device, but not limited thereto) may be prevented from cracking in the subsequent formation of stacked layers due to steep topography in the contact holes caused by the excessive number of the contact holes. In this way, the layout of metal lines and thin film transistor units in the display panel can be improved. In addition, the orthographic projection of the sidewall of the third opening (or the fourth opening) adjacent to the drain contact hole in the normal direction of the substrate (the direction Z) does not overlap with the orthographic projection of the sidewall of the drain contact hole adjacent to the third opening (or the fourth opening) in the normal direction of the substrate. Therefore, a relatively flat topography can be provided to prevent the intermediate insulation layer subsequently disposed on the insulation layer between the pixel electrode and the common electrode from cracking. Accordingly, the risk of short circuit caused by the pixel electrode in contact with the common electrode due to cracking of the intermediate insulation layer can be avoided. In this way, the electronic device of the embodiment of the disclosure has better reliability or better display quality.

Finally, it should be noted that the foregoing embodiments are merely used for describing the technical solutions of the disclosure, but are not intended to limit the disclosure. Although the disclosure has been described in detail with reference to the foregoing embodiments, a person of ordinary skill in the art should understand that modifications may still be made to the technical solutions in the foregoing embodiments, or equivalent replacements may be made to part or all of the technical features; and these modifications or replacements will not cause the essence of corresponding technical solutions to depart from the scope of the technical solutions in the embodiments of the disclosure.

The invention claimed is:

1. An electronic device, comprising:
   a substrate;
   a first conductive wire configured to transmit a first signal and disposed on the substrate and extending along a first direction;
   a plurality of semiconductors disposed on the substrate and overlapped with the first conductive wire;
   an insulation layer disposed on the substrate and having a plurality of holes; and
   a plurality of conductive elements disposed on the substrate and overlapped with the plurality of semiconductors respectively;
   wherein, in a top view of the electronic device, each one of the plurality of holes overlaps with at least one of the plurality of semiconductors, and a number of the plurality of holes is less than a number of the plurality of conductive elements,
   wherein the first conductive wire is a data line, and the first signal is a data signal.

2. The electronic device of claim 1, wherein the plurality of conductive elements and the first conductive wire are in different layers.

3. The electronic device of claim 2, wherein the plurality of conductive elements are electrodes.

4. The electronic device of claim 3, wherein the electrodes comprises pixel electrodes.

5. The electronic device of claim 1, wherein the plurality of semiconductors comprises low temperature polysilicon.

6. The electronic device of claim 1, further comprising:
   a second conductive wire, wherein the second conductive wire overlaps with one of the plurality of semiconductors.

7. The electronic device of claim 6, wherein the first conductive wire and the second conductive wire extend in different directions.

8. The electronic device of claim 6, wherein the second conductive wire transmits a second signal different from the first signal.

9. The electronic device of claim 8, wherein the second signal is a scan signal.

10. The electronic device of claim 6, wherein the plurality of conductive elements overlap with the second conductive wire.

11. An electronic device, comprising:
    a substrate;
    a first conductive wire configured to transmit a first signal and disposed on the substrate and extending along a first direction;
    a plurality of semiconductors disposed on the substrate and overlapped with the first conductive wire;
    an insulation layer disposed on the substrate and having a plurality of holes; and
    a plurality of conductive elements disposed on the substrate and overlapped with the plurality of semiconductors respectively; and
    a second conductive wire, wherein the second conductive wire overlaps with one of the plurality of semiconductors; P1 wherein, in a top view of the electronic device, each one of the plurality of holes overlaps with at least one of the plurality of semiconductors, and a number of the plurality of holes is less than a number of the plurality of conductive elements, and the first conductive wire and the second conductive wire extend perpendicularly.

12. An electronic device, comprising:
    a substrate;
    a first conductive wire configured to transmit a first signal and disposed on the substrate and extending along a first direction;
    a plurality of semiconductors disposed on the substrate and overlapped with the first conductive wire;
    an insulation layer disposed on the substrate and having a plurality of holes; and
    a plurality of conductive elements disposed on the substrate and overlapped with the plurality of semiconductors respectively; and
    a second conductive wire, wherein the second conductive wire overlaps with one of the plurality of semiconductors;
    wherein, in a top view of the electronic device, each one of the plurality of holes overlaps with at least one of the plurality of semiconductors, and a number of the plurality of holes is less than a number of the plurality of conductive elements, and
    wherein the second conductive wire is a scan line, the second conductive wire transmits a second signal different from the first signal, and the second signal is a scan signal.

* * * * *